(12) United States Patent
Matsueda

(10) Patent No.: US 10,672,857 B2
(45) Date of Patent: Jun. 2, 2020

(54) DISPLAY DEVICE

(71) Applicant: TIANMA JAPAN, LTD., Kawasaki, Kanagawa (JP)

(72) Inventor: Yojiro Matsueda, Kawasaki (JP)

(73) Assignee: TIANMA JAPAN, LTD., Kawasaki, Kanagawa (JP)

( * ) Notice: Subject to any disclaimer, the term of this patent is extended or adjusted under 35 U.S.C. 154(b) by 0 days.

(21) Appl. No.: 16/380,134

(22) Filed: Apr. 10, 2019

(65) Prior Publication Data

US 2019/0312099 A1 Oct. 10, 2019

(30) Foreign Application Priority Data

Apr. 10, 2018 (JP) .................. 2018-075536

(51) Int. Cl.
| | | |
|---|---|---|
| *H01L 27/32* | (2006.01) | |
| *G09G 3/20* | (2006.01) | |
| *G09G 3/3233* | (2016.01) | |
| *G09G 3/3266* | (2016.01) | |
| *G09G 3/3291* | (2016.01) | |

(52) U.S. Cl.
CPC ....... *H01L 27/3276* (2013.01); *G09G 3/2003* (2013.01); *G09G 3/3233* (2013.01); *G09G 3/3266* (2013.01); *G09G 3/3291* (2013.01); *H01L 27/3218* (2013.01); *H01L 27/3262* (2013.01); *G09G 2300/0426* (2013.01); *G09G 2300/0452* (2013.01); *G09G 2320/0233* (2013.01); *G09G 2360/16* (2013.01)

(58) Field of Classification Search
CPC ............. H01L 27/3276; H01L 27/3262; H01L 27/3218; G09G 3/3266; G09G 3/3291; G09G 3/3233; G09G 3/2003; G09G 2320/0233; G09G 2300/0426; G09G 2300/0452; G09G 2360/16; G09G 3/3607; G09G 2310/0232

See application file for complete search history.

(56) References Cited

U.S. PATENT DOCUMENTS

| | | | | |
|---|---|---|---|---|
| 2003/0174151 | A1* | 9/2003 | Awamoto ............. | G09G 3/2983 345/690 |
| 2013/0215360 | A1* | 8/2013 | Pollack ................ | G09G 3/3413 349/61 |
| 2014/0253422 | A1* | 9/2014 | Tomizawa ........ | G02F 1/133514 345/88 |
| 2018/0031927 | A1* | 2/2018 | Ikeda ................ | G02F 1/133345 |

FOREIGN PATENT DOCUMENTS

JP 2003-271088 A 9/2003

\* cited by examiner

*Primary Examiner* — Andrew Sasinowski
(74) *Attorney, Agent, or Firm* — Sughrue Mion, PLLC

(57) ABSTRACT

First type of pixel lines include first type of end pixels each disposed at the end on the opposite side of the first direction and at the end on the opposite side of the second direction of a pixel line extending in the second direction. The second type of pixel lines include second type of end pixels each disposed at the end on the opposite side of the first direction and at the end on the opposite side of the second direction of a pixel line extending in the second direction. Luminance values of the plurality of first type of end pixels are smaller than luminance values of internal pixels surrounded by other pixels in four directions of the first direction, the opposite direction of the first direction, the second direction, and the opposite direction of the second direction in response to the same input picture signal.

9 Claims, 11 Drawing Sheets

DISPLAY DEVICE

CROSS-REFERENCE TO RELATED APPLICATIONS

This Non-provisional application claims priority under 35 U.S.C. § 119(a) on Patent Application No. 2018-75536 filed in Japan on Apr. 10, 2018, the entire content of which is hereby incorporated by reference.

BACKGROUND

This disclosure relates to a display device.

The display region of a color display device is generally composed of red (R) subpixels, green (G) subpixels, and blue (B) subpixels arrayed on the substrate of a display panel. Various arrangements of subpixels (pixel arrangements) have been proposed; for example, RGB stripe arrangement and delta-nabla arrangement (also simply referred to as delta arrangement) have been known (for example, refer to JP 2003-271088 A).

In recent years, many products have been improved in design because of curved corners of the display region. Regarding the delta-nabla arrangement, however, jaggs along the curved corners (also referred to as R-corners) tend to be conspicuous, impairing the image quality.

SUMMARY

An aspect of this disclosure is a display device including: a plurality of first type of pixel lines each composed of a plurality of first type of pixels disposed in a first direction in a display region; and a plurality of second type of pixel lines each composed of a plurality of second type of pixels disposed in the first direction in the display region. The plurality of first type of pixel lines and the plurality of second type of pixel lines are disposed alternately in a second direction perpendicular to the first direction. Each first type of pixel consists of a first red subpixel and a first blue subpixel disposed in the second direction and a first green subpixel disposed on the opposite side of the first red subpixel and the first blue subpixel in the opposite direction of the first direction and between the first red subpixel and the first blue subpixel in the second direction. Each second type of pixel consists of a second red subpixel and a second blue subpixel disposed in the second direction and a second green subpixel disposed on the opposite side of the second red subpixel and the second blue subpixel in the first direction and between the second red subpixel and the second blue subpixel in the second direction. The plurality of first type of pixel lines include a plurality of first type of end pixels each disposed at the end on the opposite side of the first direction and at the end on the opposite side of the second direction of a pixel line extending in the second direction. The plurality of second type of pixel lines include a plurality of second type of end pixels each disposed at the end on the opposite side of the first direction and at the end on the opposite side of the second direction of a pixel line extending in the second direction. Luminance values of the plurality of first type of end pixels are smaller than luminance values of internal pixels surrounded by other pixels in four directions of the first direction, the opposite direction of the first direction, the second direction, and the opposite direction of the second direction in response to the same input picture signal.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs.

Configuration of Display Device

An overall configuration of a display device in this embodiment is described with reference to FIG. 1. The drawings may exaggerate elements in size or shape for clear understanding of the description. In the following, an organic light-emitting diode (OLED) display device is described as an example of the display device; however, the features of this disclosure are applicable to any type of display device other than the OLED display device, such as a liquid crystal display device or a quantum dot display device.

Figure 1:
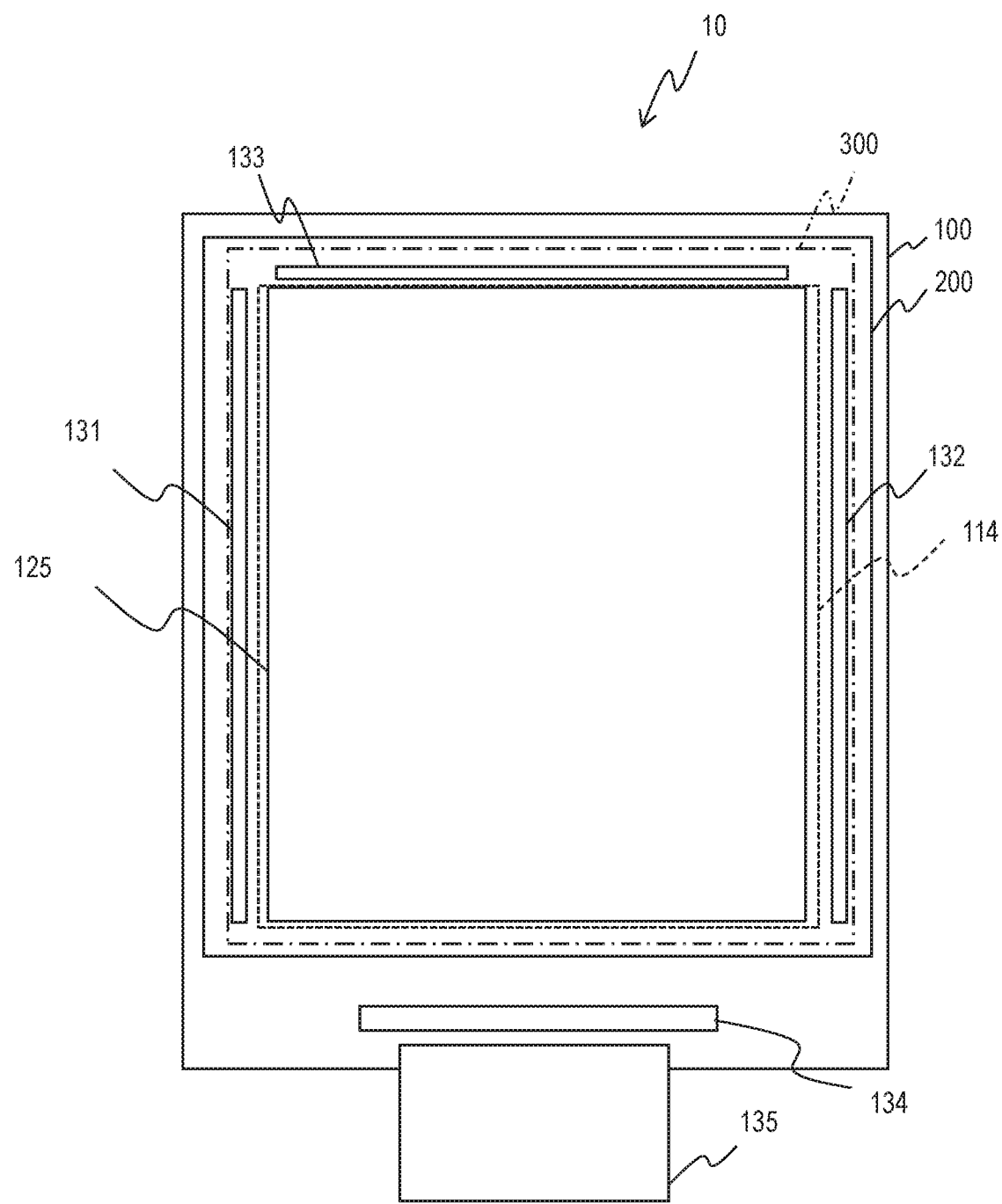
FIG. 1 schematically illustrates a configuration example of an OLED display device.

FIG. 1 schematically illustrates a configuration example of an OLED display device 10. The OLED display device 10 includes an OLED display panel and a control device. The OLED display panel includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135. The driver IC 134 is included in the control device. The scanning driver 131, the emission driver 132, and the protection circuit 133 are included in the control device or the combination of the OLED display panel and the display device.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides signals corresponding to picture data to the data lines. In other words, the driver IC 134 has a display control function. As will be described later, the driver IC 134 has a function to convert relative luminance data for the pixels of a picture frame into relative luminance data for the subpixels of the display panel.

In FIG. 1, the axis extending from the left to the right is referred to as X-axis and the axis extending from the top to the bottom is referred to as Y-axis. The scanning lines extend along the X-axis. The pixels or subpixels disposed in a line along the X-axis within the display region 125 are referred to as a pixel row or subpixel row; the pixels or subpixels disposed in a line along the Y-axis within the display region 125 are referred to as a pixel column or subpixel column.

Figure 2:
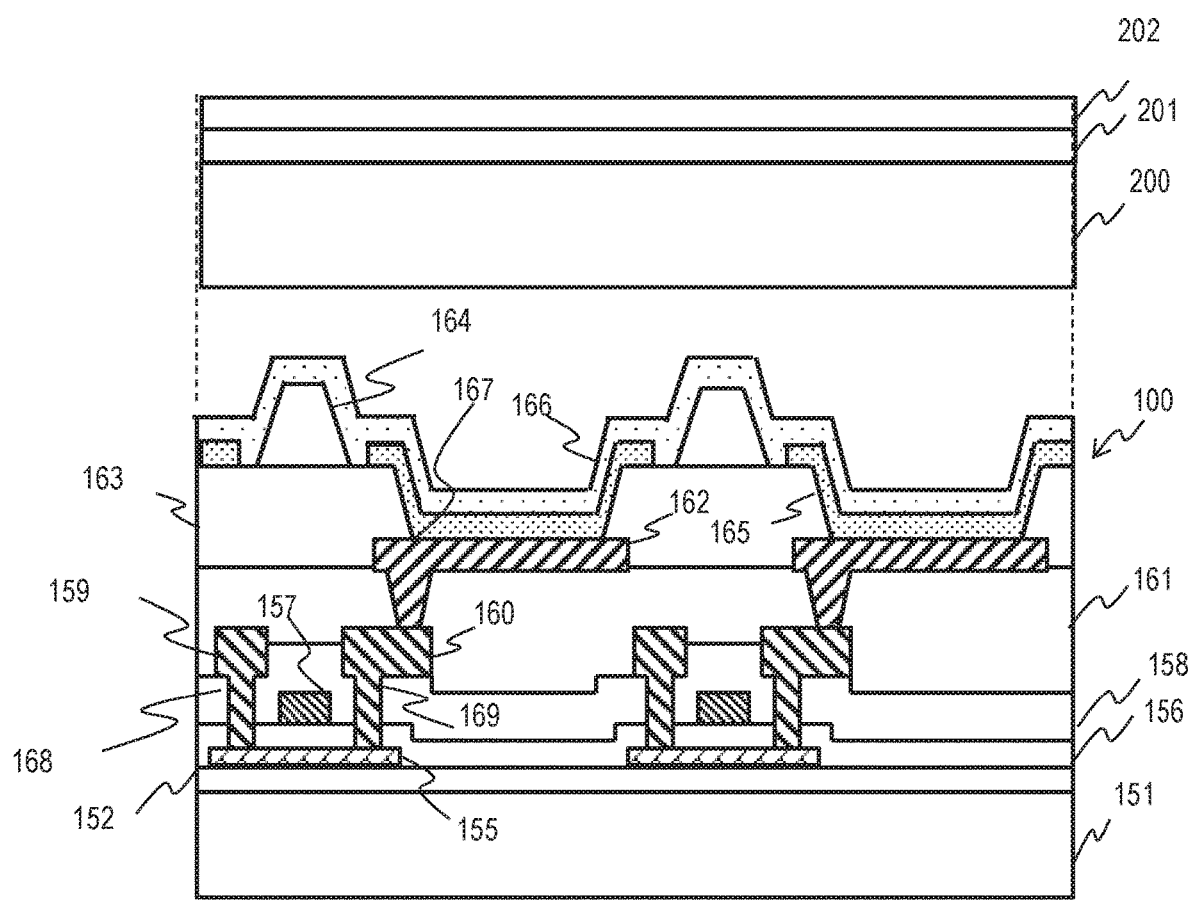
FIG. 2 illustrates an example of a top-emission pixel structure.

Next, a detailed structure of the OLED display device 10 is described. FIG. 2 schematically illustrates a part of a cross-sectional structure of the OLED display device 10. The OLED display device 10 includes a TFT substrate 100 and an encapsulation structural unit opposed to the TFT substrate 100. An example of the encapsulation structural unit is a flexible or inflexible encapsulation substrate 200. The encapsulation structural unit can be a thin film encapsulation (TFE) structure, for example.

The TFT substrate 100 includes a plurality of lower electrodes (for example, anode electrodes 162), one upper electrode (for example, a cathode electrode 166), and a plurality of organic light-emitting layers 165 disposed between an insulating substrate 151 and the encapsulation structural unit. The cathode electrode 166 is a transparent electrode that transmits the light from the organic light-emitting layers 165 (also referred to as organic light-emitting films 165) toward the encapsulation structural unit.

An organic light-emitting layer 165 is disposed between the cathode electrode 166 and an anode electrode 162. The plurality of anode electrodes 162 are disposed on the same plane (for example, on a planarization film 161) and an organic light-emitting layer 165 is disposed on an anode electrode 162.

The OLED display device 10 further includes a plurality of spacers 164 standing toward the encapsulation structural unit and a plurality of circuits each including a plurality of switches. Each of the plurality of circuits is formed between the insulating substrate 151 and an anode electrode 162 and controls the electric current to be supplied to the anode electrode 162.

FIG. 2 illustrates an example of a top-emission pixel structure. The top-emission pixel structure is configured in such a manner that the cathode electrode 166 common to the plurality of pixels is provided on the light emission side (the upper side of the drawing). The cathode electrode 166 has a shape that fully covers the entire display region 125. The features of this disclosure are also applicable to an OLED display device having a bottom-emission pixel structure. The bottom-emission pixel structure has a transparent anode electrode and a reflective cathode electrode to emit light to the external through the TFT substrate 100.

Hereinafter, the OLED display device 10 is described in more detail. The TFT substrate 100 includes subpixels arrayed within the display region 125 and lines provided in the wiring region surrounding the display region 125. The lines connect the pixel circuits with the circuits 131, 132, and 134 provided in the wiring region.

The display region 125 in this embodiment is composed of subpixels arrayed in delta-nabla arrangement. The details of the delta-nabla arrangement will be described later. Hereinafter, the OLED display panel may be referred to as delta-nabla panel. A subpixel is a light emitting region for displaying one of the colors of red (R), green (G), and blue (B). Although the example described in the following displays an image with the combination of these three colors, the OLED display device 10 may display an image with the combination of three colors different from these.

The light emitting region is included in an OLED element which is composed of an anode electrode of a lower electrode, an organic light-emitting layer, and a cathode electrode of an upper electrode. A plurality of OLED elements are formed of one cathode electrode 166, a plurality of anode electrodes 162, and a plurality of organic light-emitting layers 165.

The insulating substrate 151 is made of glass or resin, for example, and is flexible or inflexible. In the following description, the side closer to the insulating substrate 151 is defined as lower side and the side farther from the insulating substrate 151 is defined as upper side. Gate electrodes 157 are provided on a gate insulating film 156. An interlayer insulating film 158 is provided over the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with a channel 155 on an insulating layer 152 through contacts 168 and 169 provided in contact holes of the interlayer insulating film 158.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole in the planarization film 161. Pixel circuits (TFTs) are formed below the anode electrodes 162.

Above the anode electrodes 162, an insulative pixel defining layer (PDL) 163 is provided to separate OLED elements. An OLED element is composed of an anode electrode 162, an organic light-emitting layer 165, and the cathode electrode 166 (a part thereof) laminated together. The light-emitting region of an OLED element is formed in an opening 167 of the pixel defining layer 163.

Each insulative spacer 164 is provided on the pixel defining layer 163 and between anode electrodes 162. The top face of the spacer 164 is located higher than the top face of the pixel defining layer 163 or closer to the encapsulation substrate 200 and maintains the space between the OLED elements and the encapsulation substrate 200 by supporting the encapsulation substrate 200 when the encapsulation substrate 200 is deformed.

Above each anode electrode 162, an organic light-emitting layer 165 is provided. The organic light-emitting layer 165 is in contact with the pixel defining layer 163 in the opening 167 of the pixel defining layer 163 and its periphery.

A cathode electrode 166 is provided over the organic light-emitting layer 165. The cathode electrode 166 is a transparent electrode. The cathode electrode 166 transmits all or part of the visible light from the organic light-emitting layer 165.

The laminated film of the anode electrode 162, the organic light-emitting layer 165, and the cathode electrode 166 formed in an opening 167 of the pixel defining layer 163 corresponds to an OLED element. Electric current flows only within the opening 167 of the pixel defining layer 163 and accordingly, the region of the organic light-emitting layer 165 exposed in the opening 167 is the light emitting region of the OLED element, or a subpixel. The cathode electrode 166 is common to the anode electrodes 162 and the organic light-emitting layers 165 (OLED elements) that are formed separately. A not-shown cap layer may be provided over the cathode electrode 166.

The encapsulation substrate 200 is a transparent insulating substrate, which can be made of glass. A $\lambda/4$ plate 201 and a polarizing plate 202 are provided over the light emission surface (top face) of the encapsulation substrate 200 to prevent reflection of light entering from the external.

Configuration of Driver IC

Figure 3A:
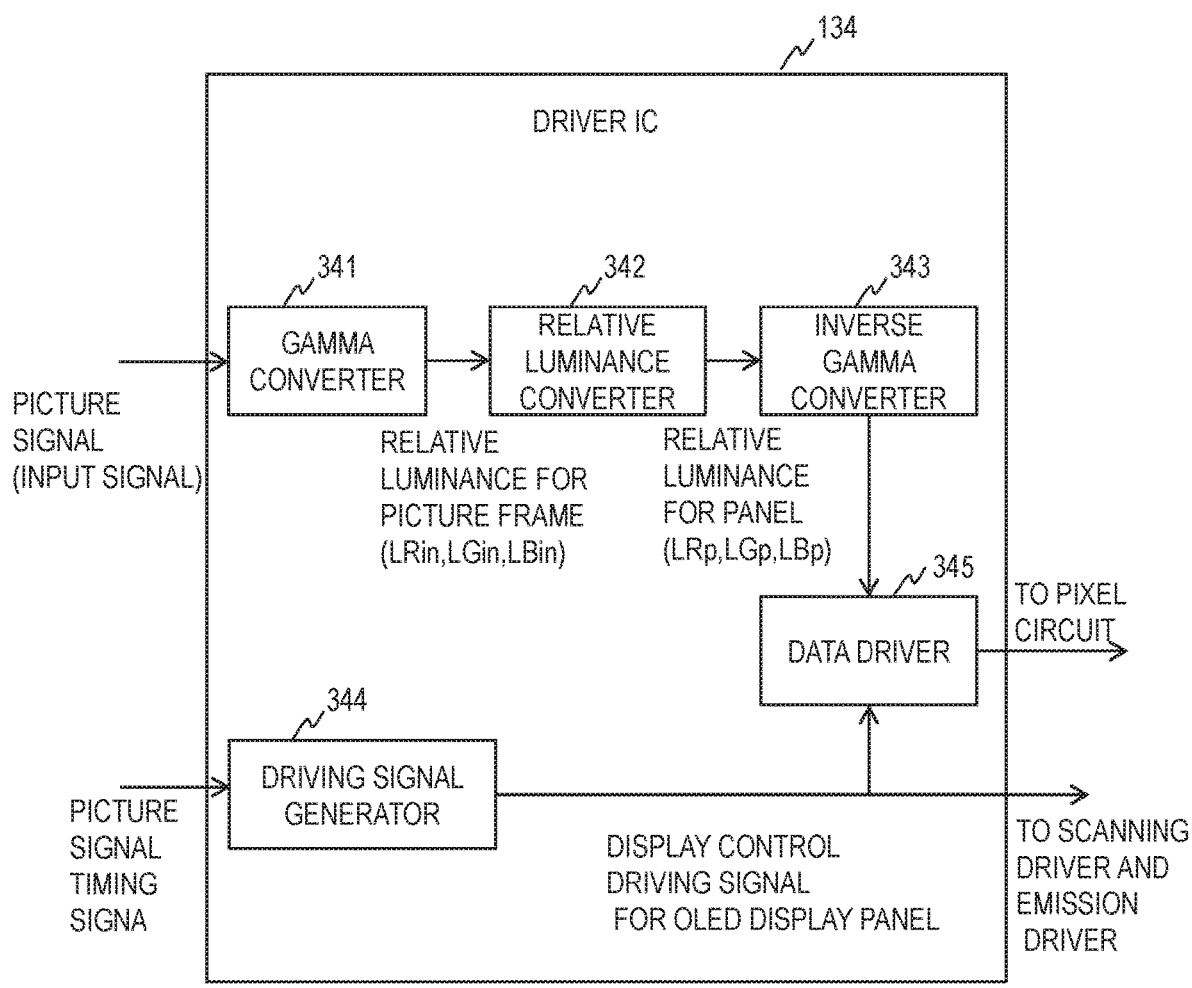
FIG. 3A illustrates logical elements of a driver IC.

FIG. 3A illustrates logical elements of the driver IC 134. The driver IC 134 includes a gamma converter 341, a relative luminance converter 342, an inverse gamma converter 343, a driving signal generator 344, and a data driver 345.

The driver IC 134 receives a picture signal and a picture signal timing signal from a not-shown main controller. The picture signal includes data (signal) for successive picture frames. The gamma converter 341 converts the RGB scale values (signal) included in the input picture signal to RGB relative luminance values. More specifically, the gamma converter 341 converts the R scale values, the G scale values, and the B scale values for individual pixels of each picture frame into R relative luminance values (LRin), G relative luminance values (LGin), and B relative luminance values (LBin). The relative luminance values for a pixel are luminance values normalized in the picture frame.

The relative luminance converter 342 converts the R, G, B relative luminance values (LRin, LGin, LBin) for individual pixels of a picture frame into R, G, B relative luminance values (LRp, LGp, LBp) for subpixels of the OLED display panel. The relative luminance value for a subpixel is a luminance value for the subpixel normalized in the OLED display panel.

The number of pixels of image data to be displayed is not always equal to the number of pixels of the display panel; the apparent resolution can be increased by rendering. In this case, the driver IC 134 first performs the rendering and then the above-described processing to convert the R, G, B relative luminance values of pixels assigned to subpixels of the display panel into the R, G. B relative luminance values for the subpixels of the OLED display panel.

As will be described later, the relative luminance converter 342 adjusts the relative luminance values for the subpixels included in specific panel pixels. Specifically, the relative luminance converter 342 determines the relative luminance values for the specific pixels to be lower than the relative luminance values for the other pixels. This processing to adjust the luminance of the specific pixels can be performed by a function unit different from the relative luminance converter 342, for example, the gamma converter 341.

The inverse gamma converter 343 converts the relative luminance values for the R subpixels, G subpixels, and B subpixels calculated by the relative luminance converter 342 to scale values for the R subpixels, G subpixels, and B subpixels. The data driver 345 sends a driving signal in accordance with the scale values for the R subpixels, G subpixels, and B subpixels to the pixel circuits.

The driving signal generator 344 converts an input picture signal timing signal to a display control driving signal for the OLED display panel. The picture signal timing signal includes a dot clock (pixel clock) for determining the data transfer rate, a horizontal synchronization signal, a vertical synchronization signal, and a data enable signal.

The driving signal generator 344 generates control signals for the data driver 345, the scanning driver 131, and the emission driver 132 of the delta-nabla panel (or the driving signal for the panel) from the dot clock, data enable signal, vertical synchronization signal, and horizontal synchronization signal in the input picture signal timing signal and outputs the signals to the drivers.

Pixel Circuit

Figure 3B:
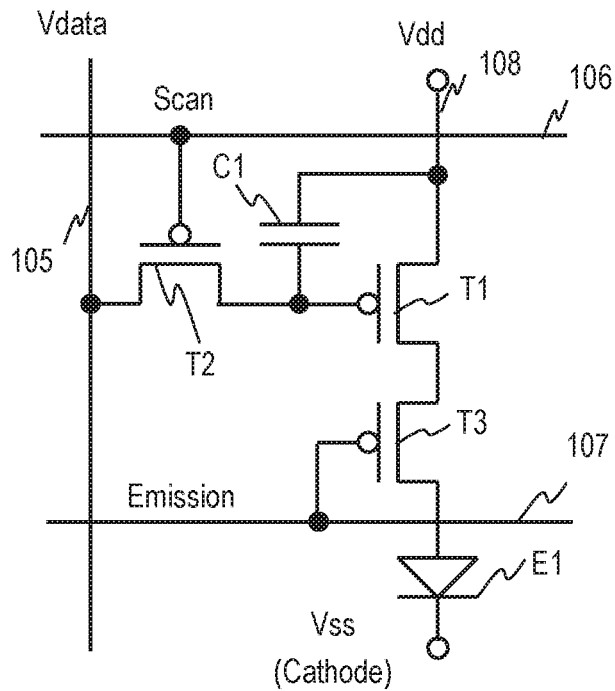
FIG. 3B illustrates an example of a pixel circuit.

A plurality of pixel circuits are formed on the substrate 100 to control the current to be supplied to the anode electrodes of subpixels. FIG. 3B illustrates a configuration example of a pixel circuit. Each pixel circuit includes a first transistor T1, a second transistor T2, a third transistor T3, and a storage capacitor C 1. The pixel circuit controls light emission of an OLED element E 1 of a subpixel. The transistors are thin film transistors (TFTs). Hereinafter, the first transistor T1 to the third transistor T3 are abbreviated as transistor T1 to transistor T3.

The transistor T2 is a switch for selecting the subpixel. The transistor T2 is a p-channel TFT and its gate terminal is connected with a scanning line 106. The drain terminal is connected with a data line 105. The source terminal is connected with the gate terminal of the transistor T1.

The transistor T1 is a transistor (driving TFT) for driving the OLED element E1. The transistor T1 is a p-channel TFT and its gate terminal is connected with the source terminal of the transistor T2. The source terminal of the transistor T1 is connected with a power line (Vdd) 108. The drain terminal is connected with the source terminal of the transistor T3. The storage capacitor C1 is provided between the gate terminal and the source terminal of the transistor T1.

The transistor T3 is a switch for controlling the supply/stop of the driving current to the OLED element E1. The transistor T3 is a p-channel TFT and its gate terminal is connected with an emission control line 107. The source terminal of the transistor T3 is connected with the drain terminal of the transistor T1. The drain terminal is connected with the OLED element E1.

Next, operation of the pixel circuit is described. The scanning driver 131 outputs a selection pulse to the scanning line 106 to open the transistor T2. The data voltage supplied from the driver IC 134 through the data line 105 is stored to the storage capacitor C1. The storage capacitor C1 holds the stored voltage during the period of one frame. The conductance of the transistor T1 changes in an analog manner in accordance with the stored voltage, so that the transistor T1 supplies a forward bias current corresponding to a light emission level to the OLED element E1.

The transistor T3 is located on the supply path of the driving current. The emission driver 132 outputs a control signal to the emission control line 107 to control the transistor T3 to be opened or closed. When the transistor T3 is open, the driving current is supplied to the OLED element E1. When the transistor T3 is closed, this supply is stopped. The lighting period (duty ratio) in the period of one field can be controlled by opening and closing the transistor T3.

Figure 3C:
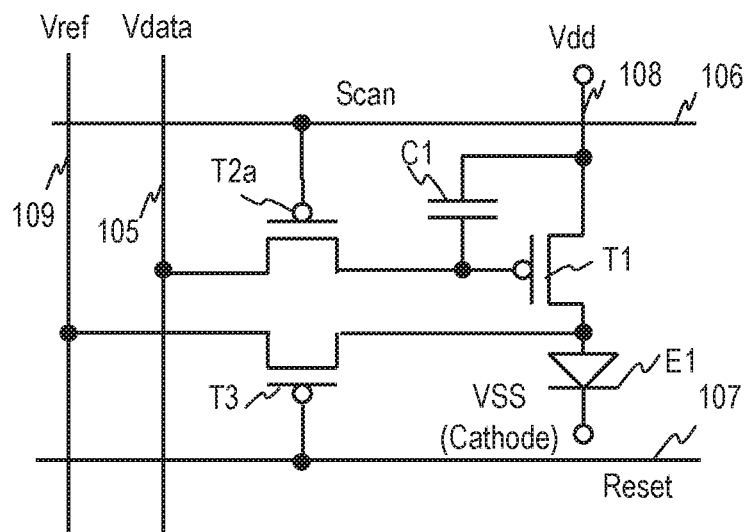
FIG. 3C illustrates another example of a pixel circuit.

FIG. 3C illustrates another configuration example of a pixel circuit. The differences from the pixel circuit in FIG. 3B are the transistor T2*a* and the transistor T3. The transistor T2*a* is a switch having the same function as the transistor T2 in FIG. 3B, or a switch for selecting the subpixel.

The transistor T3 can be used for various purposes. For example, the transistor T3 can be used to reset the anode electrode of the OLED element E 1 once to a sufficiently low voltage that is lower than the black signal level to prevent crosstalk caused by leak current between OLED elements E 1. For convenience, the reset line for controlling the gate of the transistor T3 is denoted by a reference sign 107, which is the same as the reference sign of the emission control line 107 in FIG. 3B.

The transistor T3 can also be used to measure a characteristic of the transistor T1. For example, the voltage-current characteristic of the transistor T1 can be accurately measured by measuring the current flowing from the power line (Vdd) 108 to the reference voltage supply line (Vref) 109 under the bias conditions selected so that the transistor T1 will operate in the saturated region and the switching transistor T3 will operate in the linear region. If the differences in voltage-current characteristic among the transistors T1 for individual sub-pixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 109 when the transistor T1 is off and the transistor T3 is operating in the linear region. In the case where the OLED element E1 is deteriorated because of long-term use, for example, if the deterioration is compensated for by generating a data signal at an external circuit, the display device can have a long life spun.

The circuit configurations in FIGS. 3B and 3C are examples; the pixel circuit may have a different circuit configuration. Although the pixel circuits in FIGS. 3B and 3C employ p-channel TFTs, the pixel circuit may employ n-channel TFTs.

Pixel Disposition in Delta-Nabla Panel

Figure 4:
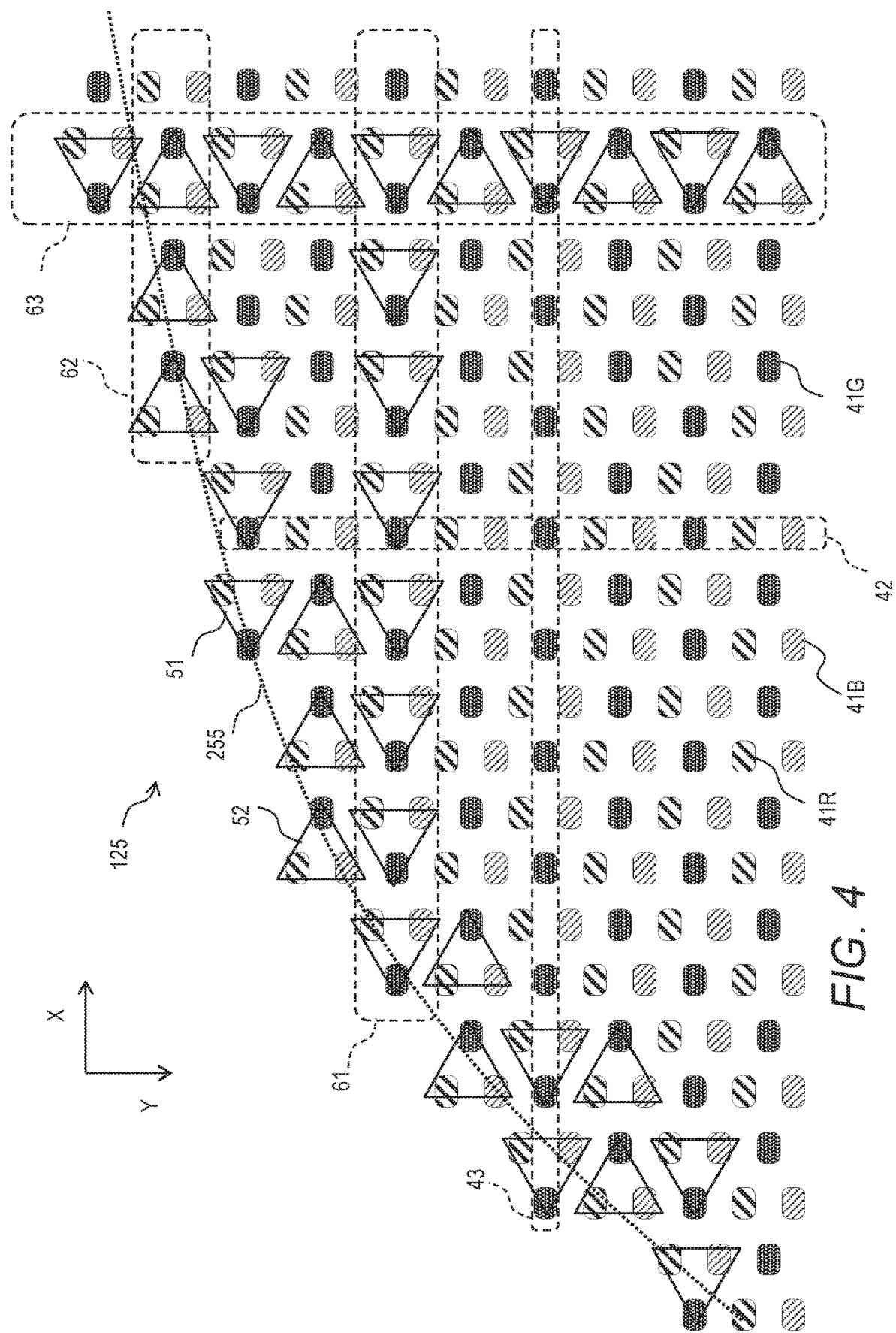
FIG. 4 illustrates a pixel disposition in a delta-nabla panel.

FIG. 4 illustrates a pixel disposition in a delta-nabla panel. FIG. 4 schematically illustrates a partial region including the boundary (edge) of the display region 125. FIG. 4 illustrates a part having a convexly curved boundary. The curve 255 represents a virtual design boundary of the display region 125. The disposition of the pixels and subpixels on the edge of the display region 125 is determined in accordance with the curve 255. Hereinafter, the part including a convexly or concavely curved boundary is referred to as R-corner.

The display region 125 is composed of a plurality of red subpixels 41R, a plurality of green subpixels 41G, and a plurality of blue subpixels 41B disposed in a plane. In FIG. 4, one of the red subpixels, one of the green subpixels, and one of the blue subpixels are provided with reference signs by way of example. The rounded rectangles identically hatched in FIG. 4 represent subpixels of the same color. Although the subpixels in FIG. 4 have rectangular shapes, subpixels may have desired shapes, such as hexagonal or octagonal shapes.

The display region 125 includes a plurality of subpixel columns 42 disposed side by side in the X-direction. In FIG. 4, one of the subpixel columns is provided with a reference sign 42 by way of example. Each subpixel column 42 is composed of subpixels disposed one above another in the Y-direction in FIG. 4. The X-direction (first direction) is a direction extending from the left to the right of FIG. 4 and the Y-direction (second direction) is a direction extending from the top to the bottom of FIG. 4. The X-direction and the Y-direction are perpendicular to each other in the plane where the subpixels are disposed.

Each subpixel column 42 is composed of red subpixels 41R, green subpixels 41G, and blue subpixels 41B disposed in turn at a predetermined pitch. In the example of FIG. 4, subpixels are cyclically disposed in the order of a red subpixel 41R, a blue subpixel 41B, and a green subpixel 41G. Two subpixel columns 42 adjacent to each other are located differently in the Y-direction; each subpixel of one subpixel column 42 is located between subpixels of the other two colors in the other subpixel column 42 in the Y-direction.

In the example of FIG. 4, each subpixel column is shifted by a half pitch with respect to the adjacent subpixel columns. One pitch is a distance between subpixels of the same color in the Y-direction. For example, a green subpixel is located at the middle between a red subpixel and a blue subpixel of an adjacent subpixel column 42 in the Y-direction.

The display region 125 includes a plurality of subpixel rows 43 disposed one above another in the Y-direction. In FIG. 4, one of the green subpixel rows is provided with a reference sign 43 by way of example. Each subpixel row 43 is composed of subpixels disposed side by side in the X-direction at a predetermined pitch. In the example of FIG. 4, each subpixel row 43 is composed of subpixels of the same color. Each subpixel row 43 is sandwiched by subpixel rows of the other two colors in the Y-direction.

In the X-direction, each subpixel of a subpixel row 43 is located between subpixels adjacent to each other in an adjacent subpixel row 43. In the example of FIG. 4, each subpixel row is shifted by a half pitch with respect to the adjacent subpixel rows. One pitch is a distance between subpixels adjacent to each other in a subpixel row 43. A subpixel is located at the middle between two subpixels adjacent to each other in an adjacent subpixel row 43 in the X-direction.

In this embodiment, a subpixel line extending in the X-direction is referred to as subpixel row and a subpixel line extending in the Y-direction is referred to as subpixel column for descriptive purposes; however, the orientations of the subpixel rows and the subpixel columns are not limited to these examples.

The display region 125 includes two types of pixels disposed in a matrix. The two types of pixels are first type of pixels 51 and second type of pixels 52. In FIG. 4, only one of the first type of pixels is provided with a reference sign 51 and only one of the second type of pixels is provided with a reference sign 52 by way of example. Either the first type of pixels or the second type of pixels are delta pixels and the remaining are nabla pixels in the delta-nabla arrangement.

In FIG. 4, some of the first type of pixels 51 are indicated by triangles oriented so that one of the vertices is located on the left and the other two vertices are located on the right. In addition, some of the second type of pixels 52 are indicated by triangles oriented so that one of the vertices is located on the right and the other two vertices are located on the left. The right in FIG. 4 is on the side of the X-direction and the left in FIG. 4 is on the opposite side of the X-direction. The pixels 51 can be referred to as second type of pixels and the pixels 52 can be referred to as first type of pixels.

A first type of pixel 51 and a second type of pixel 52 each consist of one green subpixel 41G, and the red subpixel 41R and the blue subpixel 41B adjacent to (closest to) the green subpixel 41G in a subpixel column 42 adjacent to the subpixel 41G.

In a first type of pixel 51, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B. The subpixel column 42 including the green subpixel 41G is on the opposite side of the X-direction or on the left in FIG. 4 of the subpixel column 42 including the red subpixel 41R and the blue subpixel 41B. The green subpixel 41G is located between the red subpixel 41R and the blue subpixel 41B, more specifically, at the middle therebetween in the Y-direction.

In a second type of pixel 52, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B. The subpixel column 42 including the green subpixel 41G is on the side of the X-direction or on the right in FIG. 4 of the subpixel column 42 including the red subpixel 41R and the blue subpixel 41B. The green subpixel 41G is located between the red subpixel 41R and the blue subpixel 41B, more specifically, at the middle therebetween in the Y-direction.

The display region 125 includes a plurality of pixel rows (pixel lines extending in the X-direction) extending in the X-direction and disposed one above another in the Y-direction. The plurality of pixel rows include two types of pixel rows: first type of pixel rows 61 and second type of pixel rows 62. In FIG. 4, one of the first type of pixel rows is provided with a reference sign 61 by way of example. Further, one of the second type of pixel rows is provided with a reference sign 62 by way of example.

A first type of pixel row 61 is composed of first type of pixels 51 disposed side by side in the X-direction. A second type of pixel row 62 is composed of second type of pixels 52 disposed side by side in the X-direction. In the display region 125, first type of pixel rows 61 and second type of pixel rows 62 are disposed alternately in the Y-direction.

The display region 125 includes a plurality of pixel columns (pixel lines extending in the Y-direction) 63 extending in the Y-direction and disposed side by side in the X-direction. In FIG. 4, one of the pixel columns is provided with a reference sign 63 by way of example. Each pixel column is composed of first type of pixels 51 and second type of pixels 52 disposed alternately in the Y-direction at a predetermined pitch.

Figure 5:
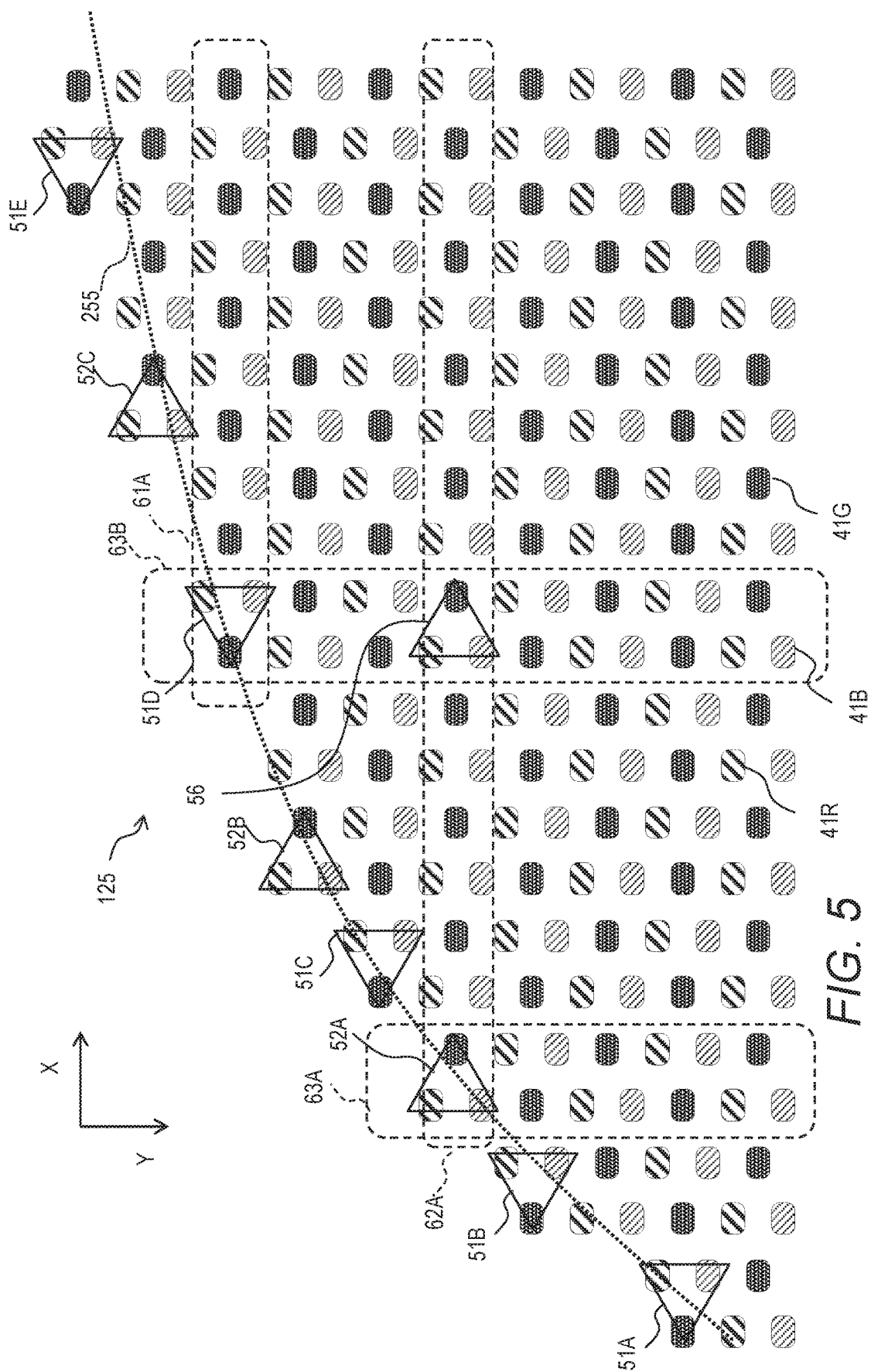
FIG. 5 illustrates end pixels included in the part of the display region illustrated in FIG. 4.

FIG. 5 illustrates end pixels included in the part of the display region 125 illustrated in FIG. 4. An end pixel is a pixel disposed at both an end of a pixel row and an end of a pixel column. An end pixel of a first type of pixel is referred to as first type of end pixel and an end pixel of a second type of pixel is referred to as second type of end pixel. A pixel disposed at at least either an end of a pixel row or an end of a pixel column is referred to as boundary pixel. An end pixel is a boundary pixel, too. The locations of boundary pixels are determined in accordance with the boundary 255.

FIG. 5 includes first type of end pixels 51A to 51E and second type of end pixels 52A, 52B, and 52C. For example, the first type of end pixel 51D is located at the left end of the first type of pixel row 61A and further, located at the upper end of the pixel column 63B. The second type of end pixel 52A is located at the left end of the second type of pixel row 62A and further, located at the upper end of the pixel column 63A. A pixel row or a pixel column can consist of a single pixel. The single pixel is disposed at the end of the pixel row or the pixel column.

Since an end pixel is located at an end of a pixel row and an end of a pixel column, the end pixel is exposed to the outside of the display region in the two directions along the pixel row and the pixel column. In the example of FIG. 5, the first type of end pixels 51A to 51E and the second type of end pixels 52A, 52B, and 52C are disposed at the left end (the end on the opposite side of the X-direction) of a pixel row and at the upper end (the end on the opposite side of the Y-direction) of a pixel column. The first type of end pixels 51A to 51E and the second type of end pixels 52A, 52B, and 52C are exposed at the left (on the opposite side of the X-direction) and the top (on the opposite side of the Y-direction).

The first type of end pixels 51A to 51E are exposed at the green subpixel 41G therein. The second type of end pixels 52A, 52B, and 52C are exposed at the opposite of the green subpixel 41G therein (at the red subpixel 41R and the blue subpixel 41B therein). In other words, the green subpixels 41G of the first type of end pixels 51A to 51E are oriented outward of the display region 125 and the green subpixels 41G of the second type of end pixels 52A, 52B, and 52C are oriented inward of the display region 125. As noted from FIG. 5, in each of the first type of end pixels 51A to 51E, the angle between the vector directed from the centroid of the pixel toward its green subpixel 41G and the normal vector directed outward at the point on the display region boundary 255 closest to the aforementioned centroid is an acute angle. Contrarily, in each of the second type of end pixels 52A, 52B, and 52C, the angle between the vector directed from the centroid of the pixel toward its green subpixel 41G and the normal vector directed outward at the point on the display region boundary 255 closest to the aforementioned centroid is an obtuse angle.

Luminance Adjustment

The research by the inventor revealed that the end pixels (the green subpixels thereof) on an R-corner are intensely seen to accentuate the jaggs on the R-corner, if the green subpixels are oriented outward. For this reason, the OLED display device 10 relatively reduces the luminance of the pixels on the R-corner that are intensely seen.

That is to say, the OLED display device 10 reduces the luminance of specific end pixels to a level lower than the luminance of the other pixels in response to the same input signal. This operation (smoothing) makes the jaggs on the R-corner less conspicuous.

Specifically, the OLED display device 10 reduces the luminance of the first type of end pixels 51A to 51E to a level relatively lower than the luminance of internal pixels 56. An internal pixel 56 is a pixel surrounded by other pixels, more specifically, a pixel adjacent to other pixels in the four directions of the X-direction, the opposite direction of the X-direction, the Y-direction, and the opposite direction of the Y-direction.

The OLED display device 10 reduces the luminance of the first type of end pixels 51A to 51E to a level lower than the luminance of the internal pixels 56 in response to the same input picture signal. The OLED display device 10 can reduce the luminance of a part of the first type of end pixels 51A to 51E, for example only the first type of end pixels 51A and 52B, to a level lower than the luminance of the internal pixels 56.

End pixels including an outward-oriented green subpixel are seen more intensely than end pixels including an inward-oriented green subpixel and further, boundary pixels other than the end pixels. The OLED display device 10 reduces the luminance of the first type of end pixels 51A to 51E to a level lower than the luminance of the second type of end pixels 52A, 52B, and 52C in response to the same input picture signal. In addition, the OLED display device 10 reduces the luminance of the first type of end pixels 51A to 51E to a level lower than the luminance of the boundary pixels that are not end pixels in response to the same input picture signal.

The OLED display device 10 equalizes the luminance of the end pixels including an inward-oriented green subpixel to the luminance of the internal pixels and the boundary pixels that are not end pixels in response to the same input picture signal. This is because there is no significant difference in visibility between the end pixels including an inward-oriented green subpixel and the internal pixels or the boundary pixels that are not end pixels. The luminance of the end pixels including an inward-oriented green subpixel can be lower than the luminance of the internal pixels and/or the boundary pixels that are not end pixels.

Figure 6:
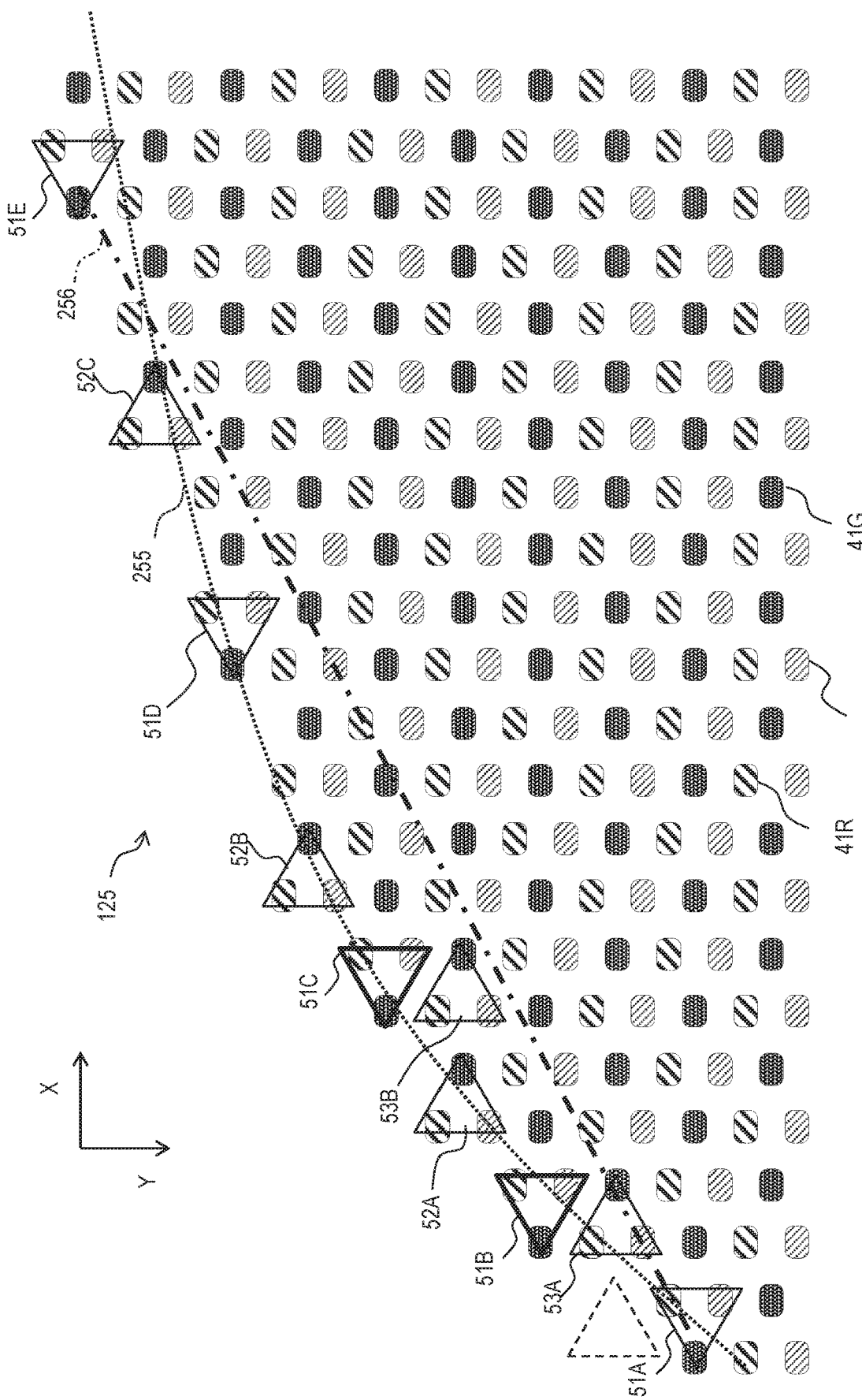
FIG. 6 illustrates an example of assigning different luminance values to the end pixels including an outward-oriented green subpixel on a convex R-corner.

FIG. 5 illustrates a convex R-corner. The OLED display device 10 can assign different luminance values to the end pixels including an outward-oriented green subpixel included in the convex R-corner. FIG. 6 illustrates an example of assigning different luminance values to the end pixels including an outward-oriented green subpixel on the convex R-corner.

As illustrated in FIG. 6, the R-corner includes a plurality of end pixels located differently in the X-direction and the Y-direction. In the example of FIG. 6, the locations of the first type of end pixels 51A to 51E and the second type of end pixels 52A, 52B, and 52C are different in the X-direction and the Y-direction. Furthermore, in the convex R-corner, the green subpixels 41G of the first type of end pixels 51B, 51C, and 51D between the green subpixels 41G of the first type of end pixels 51A and 51E are located outer than the line 256 connecting the green subpixels 41G of the first type of end pixels 51A and 51E.

In the example illustrated in FIG. 6, the OLED display device 10 reduces the luminance of the first type of end pixel 51B to a level lower than the luminance of the first type of end pixels 51C, 51D, and 51E in response to the same input picture signal. This is because that the first type of end pixel 51B can be seen more intensely than the first type of end pixels 51C, 51D, and 51E.

The first type of end pixel 51B is adjacent to the second type of pixel 53A on the lower side or in the Y-direction. The second type of pixel 53A is a boundary pixel located at an end of the second type of pixel row and is exposed at the left or on the opposite side of the X-direction (having no adjacent second type of pixel).

In contrast, the first type of end pixel 51C, for example, is adjacent to the second type of pixel 53B in the Y-direction (on the lower side). There is another second type of end pixel 52A on the left of the second type of pixel 53B. In other words, the second type of pixel 53B is adjacent to the second type of end pixel 52A disposed on the opposite side of the X-direction. The other first type of end pixels 51D and 51E each have another second type of pixel disposed on the lower left.

For example, the relative luminance converter 342 multiplies each of the luminance values Y of the first type of end pixels 51A to 51E by a predetermined correction coefficient to reduce their luminance to a level lower than the luminance of the other pixels. The luminance value of a pixel $Y_{R,G,B}$ is calculated by $\alpha_k \times (d/255)\gamma$, where $\alpha_k$ represents a correction coefficient, d represents a scale value, and $\gamma$ represents a gamma value.

In an example, letting the correction coefficient for the first type of end pixel 51A, 51C, and 51D be $\alpha_2$, the correction coefficient for the first type of end pixel 51B be $\alpha_3$, and the correction coefficient for the first type of end pixel 51E be $\alpha_1$, the relation of $\alpha_0 (=1.0) > \alpha_1 > \alpha_2 > \alpha_3$ is satisfied. The correction coefficients for the other boundary pixels in FIG. 6 are $\alpha_0 (=1.0)$. Accordingly, among the pixels shown in FIG. 6, the luminance of the first type of end pixel 51B is to be the lowest for the same input signal.

As understood from the foregoing formula, the chromaticity is maintained in the luminance adjustment of a pixel. Accordingly, color change caused by the luminance adjustment can be prevented. Such operation of relatively reducing the luminance of the pixels to be seen more intensely among the end pixels including an outward-oriented green subpixel can prevent impairment of image quality more effectively.

The luminance correction coefficient $\alpha_k$ for an end pixel including an outward-oriented green subpixel is determined depending on the disposition of the pixels. In an example, the luminance correction coefficient $\alpha_k$ is determined in accordance with the radius of curvature of the boundary 255 at the end pixel including an outward-oriented green subpixel. For example, in an end pixel including an outward-oriented green subpixel, a point on the boundary 255 closest to the centroid of the end pixel is selected and the radius of curvature of the boundary 255 at the point is determined. When the radius of curvature is larger, a smaller luminance correction coefficient $\alpha_k$ is assigned. For example, a plurality of ranges of radius of curvature are defined and each range is assigned a luminance correction coefficient $\alpha_k$.

Figure 7:
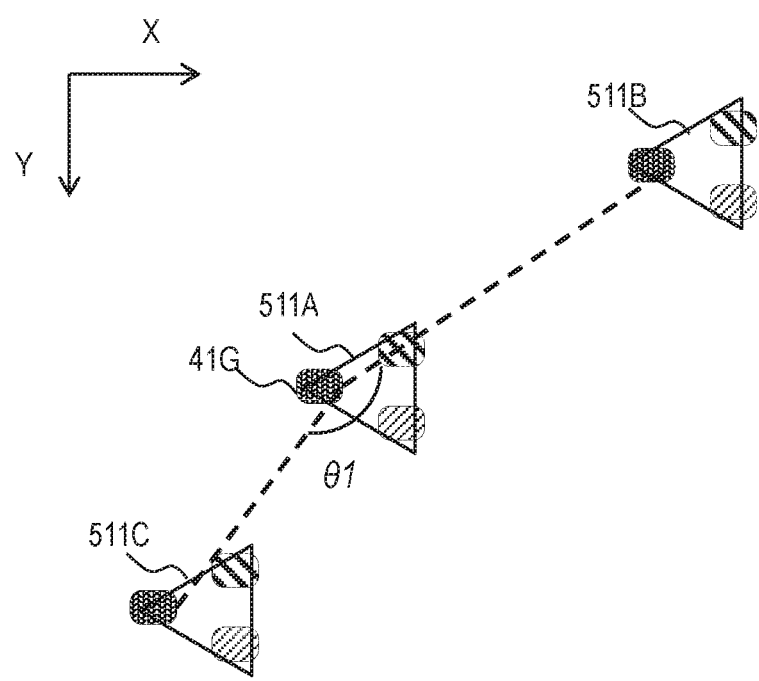
FIG. 7 illustrates an example of the angle of an end pixel including an outward-oriented green subpixel with adjacent end pixels including an outward-oriented green subpixel.

In another example, the luminance correction coefficient $\alpha_k$ for an end pixel including an outward-oriented green subpixel is determined based on the angle with the adjacent end pixels having an outward-oriented green subpixel. FIG. 7 illustrates an example of the angle of an end pixel including an outward-oriented green subpixel with adjacent end pixels including an outward-oriented green subpixel. A first type of end pixel 511A is sandwiched by first type of end pixels 511B and 511C adjacent thereto.

The inner angle or the angle opening toward the display region between the line connecting a specific point of the first type of end pixel 511A and the corresponding point of the first type of end pixel 511B and the line connecting the same point of the first type of end pixel 511A and the corresponding point of the first type of end pixel 511C is denoted by θ1. The luminance correction coefficient $\alpha_k$ to be assigned to the first type of end pixel 511A is determined based on the angle θ1. When the angle θ1 is smaller, a smaller luminance correction coefficient $\alpha_k$ is assigned. For example, a plurality of ranges are defined for the angle θ1 and each range is assigned a luminance correction coefficient $\alpha_k$.

Figure 8:
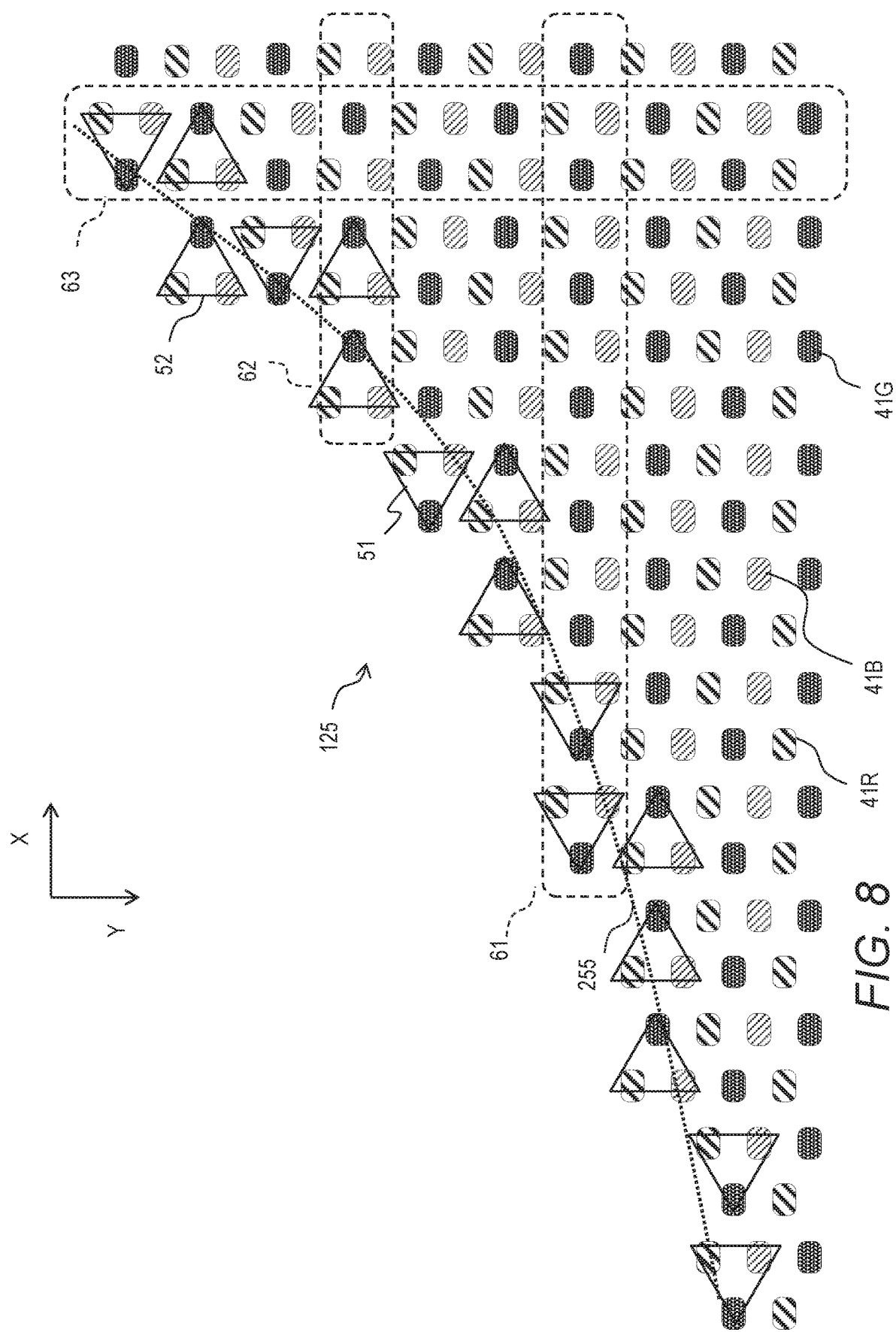
FIG. 8 schematically illustrates a partial region including the boundary of a display region.

Next, an example of a concave R-corner is described. FIG. 8 illustrates another example of pixel disposition in a delta-nabla panel. FIG. 8 schematically illustrates a partial region including the boundary (edge) of a display region 125. FIG. 8 illustrates a part having a concavely curved boundary 255.

In FIG. 8, only one of the first type of pixels is provided with a reference sign 51 and only one of the second type of pixels is provided with a reference sign 52 by way of example. In FIG. 8, one of the first type of pixel rows is provided with a reference sign 61 and one of the second type of pixel rows is provided with a reference sign 62 by way of example. Further in FIG. 8, one of the pixel columns is provided with a reference sign 63 by way of example. The description provided with reference to FIG. 4 applies to the first type of pixels, the second type of pixels, the first type of pixel rows, the second type of pixel rows, and the pixel columns.

Figure 9:
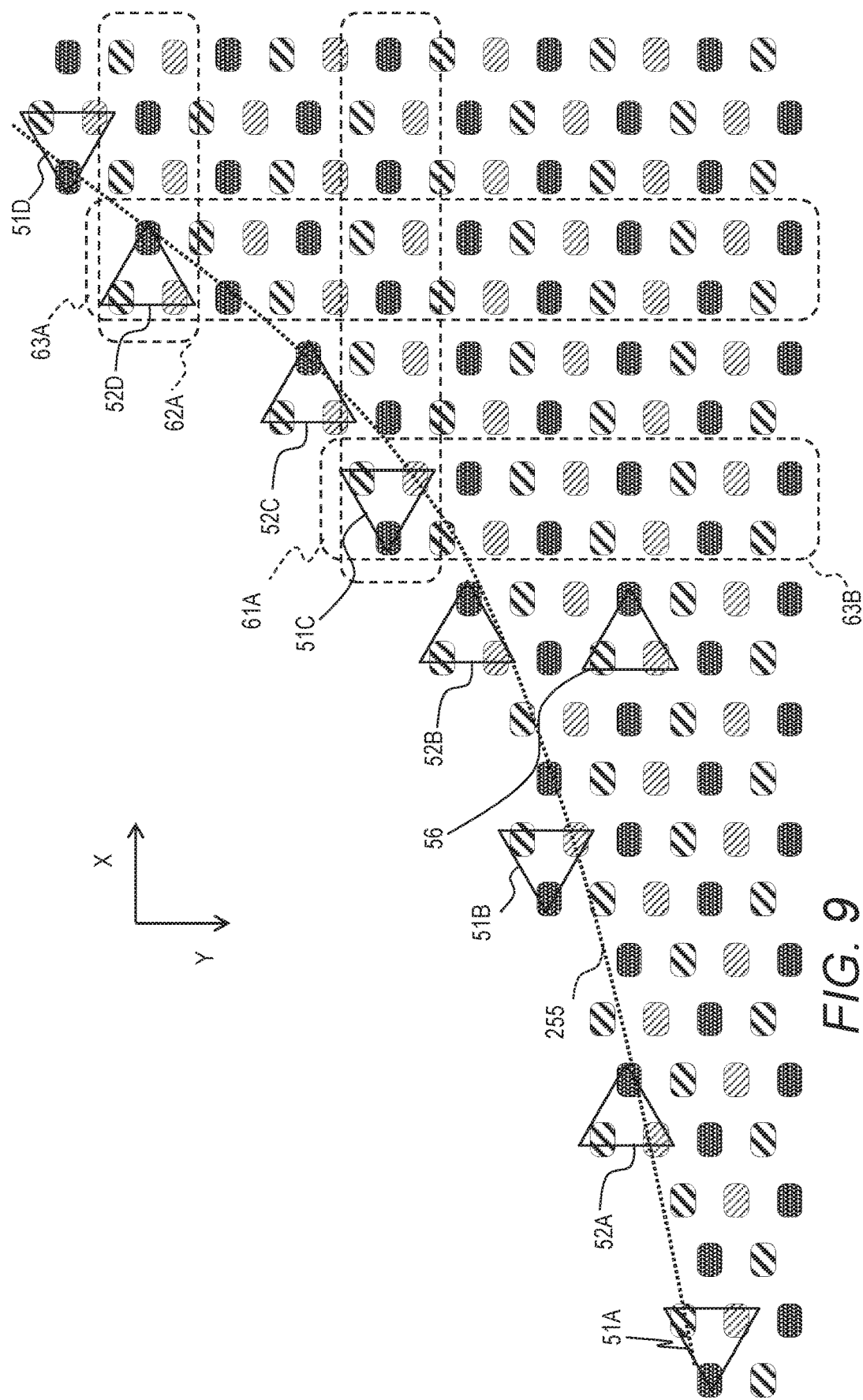
FIG. 9 illustrates first type of end pixels and second type of end pixels on a concave R-corner.

FIG. 9 illustrates first type of end pixels 51A to 51D and second type of end pixels 52A to 52D on a concave R-corner. For example, the first type of end pixel 51C is located at the left end of the first type of pixel row 61A and the upper end of the pixel column 63B. The second type of end pixel 52D is located at the left end of the second type of pixel row 62A and the upper end of the pixel column 63A.

Since an end pixel is located at an end of a pixel row and an end of a pixel column, the end pixel is exposed to the outside of the display region in the two directions along the pixel row and the pixel column. In the example of FIG. 9, the first type of end pixels 51A to 51D and the second type of end pixels 52A to 52D are disposed at the left end (the end on the opposite side of the X-direction) of a pixel row and the upper end (the end on the opposite side of the Y-direction) of a pixel column. The first type of end pixels 51A to 51D and the second type of end pixels 52A to 52D are exposed at the left (on the opposite side of the X-direction) and the top (on the opposite side of the Y-direction).

The first type of end pixels 51A to 51D are exposed at the green subpixel 41G therein. The second type of end pixels 52A to 52D are exposed at the opposite of the green subpixel 41G therein (at the red subpixel 41R and the blue subpixel 41B therein). In other words, the green subpixels 41G of the first type of end pixels 51A to 51D are oriented outward of the display region 125 and the green subpixels 41G of the second type of end pixels 52A, to 52D are oriented inward of the display region 125.

As noted from FIG. 9, in each of the first type of end pixels 51A to 51D, the angle between the vector directed from the centroid of the pixel toward its green subpixel 41G and the normal vector directed outward at the point on the display region boundary 255 closest to the aforementioned centroid is an acute angle. Contrarily, in each of the second type of end pixels 52A to 52D, the angle between the vector directed from the centroid of the pixel toward its green subpixel 41G and the normal vector directed outward at the point on the display region boundary 255 closest to the aforementioned centroid is an obtuse angle.

The OLED display device 10 reduces the luminance of the first type of end pixels 51A to 51D to a level lower than the luminance of the internal pixels 56 in response to the same input picture signal. The OLED display device 10 can reduce the luminance of a part of the first type of end pixels 51A to 51D. For example, the OLED display device 10 reduces the luminance of the first type of end pixels 51A to 51D to a level lower than the luminance of the second type of end pixels 52A to 52D in response to the same input picture signal. In addition, the OLED display device 10 reduces the luminance of the first type of end pixels 51A to 51D to a level lower than the luminance of the boundary pixels that are not end pixels in response to the same input signal.

The OLED display device 10 equalizes the luminance of the second type of end pixels 52A to 52D to the luminance of the internal pixels 56 and the boundary pixels that are not end pixels. The luminance of the second type of end pixels 52A to 52D can be lower than the luminance of the internal pixels 56 and/or the boundary pixels that are not end pixels.

Figure 10:
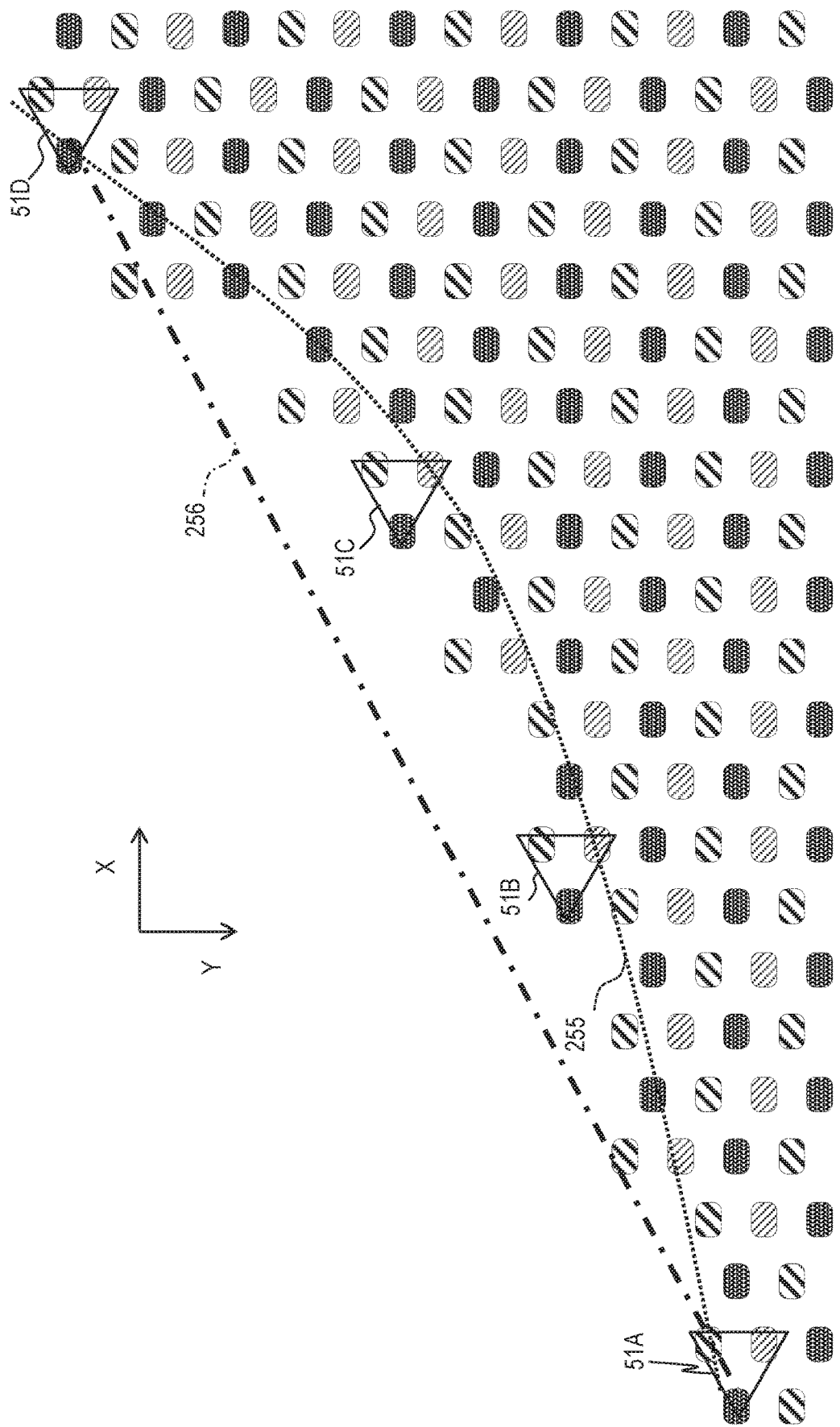
FIG. 10 illustrates a locational relation of end pixels including an outward-oriented green subpixel on the concave R-corner.

FIG. 9 illustrates a concave R-corner. FIG. 10 illustrates a locational relation of end pixels including an outward-oriented green subpixel on the concave R-corner. In the concave R-corner, the green subpixels 41G of the first type of end pixels 51B and 51C between the green subpixels 41G of the first type of end pixels 51A and 51D are located inner than the line 256 connecting the green subpixels 41G of the first type of end pixels 51A and 51D.

The OLED display device 10 can assign different luminance values to the end pixels including an outward-oriented green subpixel included in the concave R-corner. The OLED display device 10 can determine the luminance correction coefficient (the luminance value after adjustment/the luminance value before adjustment) for an end pixel including an outward-oriented green subpixel depending on the radius of curvature of the boundary 255 or the angle with the adjacent end pixels including an outward-oriented green subpixel, for example.

The luminance correction coefficients for the end pixels including an outward-oriented green subpixel can be different between a concave R-corner and a convex R-corner. Specifically, the luminance of the end pixels including an outward-oriented green subpixel in a convex R-corner is adjusted to be lower than the luminance of the end pixels including an outward-oriented green subpixel in a concave R-corner. This is because the end pixels including an outward-oriented green subpixel in a convex R-corner is seen more intensely.

For example, in the display region 125, the luminance correction coefficient for an end pixel including an outward-oriented green subpixel in a convex R-corner can be equal to or lower than the luminance correction coefficient for an end pixel including an outward-oriented green subpixel in a concave R-corner having the same radius of curvature. For example, the display region 125 can include an end pixel including an outward-oriented green subpixel in a convex R-corner for which the luminance correction coefficient is lower than the luminance correction coefficient for an end pixel including an outward-oriented green subpixel in a concave R-corner having the same radius of curvature.

For example, for the same input picture signal, the minimum luminance value for the end pixels including an outward-oriented green subpixel in a convex R-corner in the display region 125 can be smaller than the minimum luminance value for the end pixels including an outward-oriented green subpixel in a concave R-corner. That is to say, the minimum luminance correction rate for the end pixels including an outward-oriented green subpixel in a convex R-corner is lower than the minimum luminance correction rate for the end pixels including an outward-oriented green subpixel in a concave R-corner.

Alternatively, for the same input picture signal, the average of the luminance values to be assigned to the end pixels including an outward-oriented green subpixel in all convex R-corners can be smaller than the average of the luminance values to be assigned to the end pixels including an outward-oriented green subpixel in all concave R-corners. The average of the luminance correction coefficients for the end pixels including an outward-oriented green subpixel in a convex R-corner can be smaller than the average of the luminance correction coefficients for the end pixels including an outward-oriented green subpixel in a concave R-corner.

As described above, in a concave R-corner, impairment of display quality can be prevented by relatively reducing the luminance of the end pixels including an outward-oriented green subpixel. The luminance adjustment in this disclosure is applicable to any kind of display devices different from the OLED display device that have a display region in delta-nabla arrangement. Although OLED display devices control the luminance with the driving current for the light-emitting elements of subpixels, liquid crystal display devices control the luminance (light to be transmitted) with the voltage applied to the liquid crystal.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
    a plurality of first type of pixel lines each composed of a plurality of first type of pixels disposed in a first direction in a display region; and
    a plurality of second type of pixel lines each composed of a plurality of second type of pixels disposed in the first direction in the display region,
    wherein the plurality of first type of pixel lines and the plurality of second type of pixel lines are disposed alternately in a second direction perpendicular to the first direction,
    wherein each first type of pixel consists of a first red subpixel and a first blue subpixel disposed in the second direction and a first green subpixel disposed on the opposite side of the first red subpixel and the first blue subpixel in the opposite direction of the first direction and between the first red subpixel and the first blue subpixel in the second direction,
    wherein each second type of pixel consists of a second red subpixel and a second blue subpixel disposed in the second direction and a second green subpixel disposed on the opposite side of the second red subpixel and the second blue subpixel in the first direction and between the second red subpixel and the second blue subpixel in the second direction,
    wherein the plurality of first type of pixel lines include a plurality of first type of end pixels each disposed at the end on the opposite side of the first direction and at the end on the opposite side of the second direction of a pixel line extending in the second direction,
    wherein the plurality of second type of pixel lines include a plurality of second type of end pixels each disposed at the end on the opposite side of the first direction and at the end on the opposite side of the second direction of a pixel line extending in the second direction, and
    wherein luminance values of the plurality of first type of end pixels are smaller than luminance values of internal pixels surrounded by other pixels in four directions of the first direction, the opposite direction of the first direction, the second direction, and the opposite direction of the second direction in response to the same input picture signal.

2. The display device according to claim 1, wherein chromaticity values of the plurality of first type of end pixels are equal to chromaticity values of the internal pixels in response to the same input picture signal.

3. The display device according to claim 1,
    wherein the plurality of first type of end pixels include a first first-type of end pixel and a second first-type of end pixel,
    wherein a second type of pixel adjacent to the first first-type of end pixel in the second direction is disposed at the end of a second type of pixel line on the opposite side of the first direction,
    wherein a second type of pixel adjacent to the second first-type of end pixel in the second direction is adjacent to another second type of pixel disposed on the opposite side of the first direction, and
    wherein a luminance value of the first first-type of end pixel is smaller than a luminance value of the second first-type of end pixel in response to the same input picture signal.

4. The display device according to claim 1, wherein luminance values of the plurality of second type of end pixels are greater than luminance values of the plurality of first type of end pixels in response to the same input picture signal.

5. The display device according to claim 4, wherein luminance values of the plurality of second type of end pixels are equal to luminance values of the internal pixels in response to the same input picture signal.

6. The display device according to claim 1, wherein green subpixels of first type of end pixels sandwiched by first type of end pixels at both ends among the plurality of first type of end pixels are located outer than a straight line connecting green subpixels of the first type of end pixels at the both ends.

7. The display device according to claim 6,
    wherein the plurality of first type of end pixels include a first first-type of end pixel and a second first-type of end pixel,
    wherein an angle between straight lines connecting the first first-type of end pixel with first type of end pixels on both sides of the first first-type of end pixel is smaller than an angle between straight lines connecting the second first-type of end pixel with first type of end pixels on both sides of the second first-type of end pixel, and
    wherein a luminance value of the first first-type of end pixel is smaller than a luminance value of the second first-type of end pixel in response to the same input picture signal.

8. The display device according to claim 1,
    wherein the display region includes a first group composed of a plurality of first type of end pixels and a second group composed of a plurality of first type of end pixels different from the plurality of first type of end pixels of the first group,
    wherein, in the first group, green subpixels of first type of end pixels sandwiched by first type of end pixels at both ends are located outer than a straight line connecting green subpixels of the first type of end pixels at the both ends,
    wherein, in the second group, green subpixels of first type of end pixels sandwiched by first type of end pixels at both ends are located inner than a straight line connecting green subpixels of the first type of end pixels at the both ends, and
    wherein a minimum luminance value in the first group is smaller than a minimum luminance value in the second group in response to the same input picture signal.

9. The display device according to claim 1, further comprising:
    pixel circuits configured to control luminance of the plurality of first type of pixels and the plurality of second type of pixels; and a control device configured to control operation of the pixel circuits, wherein the control device is configured to control the pixel circuits so that luminance values of the plurality of first type of end pixels become smaller than luminance values of the internal pixels in response to the same input picture signal.

\* \* \* \* \*